US012591379B2

(12) United States Patent
Mortazavi et al.

(10) Patent No.: US 12,591,379 B2
(45) Date of Patent: Mar. 31, 2026

(54) LOW POWER AND WIDE DYNAMIC RANGE ANALOG-TO-DIGITAL CONVERTER

(71) Applicant: Ambiq Micro, Inc., Austin, TX (US)

(72) Inventors: Yousof Mortazavi, Austin, TX (US); Roger Serwy, Austin, TX (US)

(73) Assignee: Ambiq Micro, Inc., Austin, TX (US)

( * ) Notice: Subject to any disclaimer, the term of this patent is extended or adjusted under 35 U.S.C. 154(b) by 0 days.

(21) Appl. No.: 18/053,601

(22) Filed: Nov. 8, 2022

(65) Prior Publication Data

US 2023/0275597 A1      Aug. 31, 2023

Related U.S. Application Data

(60) Provisional application No. 63/277,159, filed on Nov. 8, 2021.

(51) Int. Cl.
*H03M 1/00* (2006.01)
*G06F 3/06* (2006.01)
(Continued)

(52) U.S. Cl.
CPC .......... *G06F 3/0625* (2013.01); *G06F 3/0659* (2013.01); *G06F 3/0679* (2013.01);
(Continued)

(58) Field of Classification Search
CPC .......... H03M 1/12; H03M 1/38; H03M 1/002; H03M 1/1245; H03M 1/1295; H03M 1/466; H03M 1/468; H03M 1/02; H03M 1/06; H03M 1/0617; H03M 1/0626; H03M 1/0631; H03M 1/0678; H03M 1/0845; H03M 1/0854; H03M 1/0872; H03M 1/089; H03M 1/1009; H03M 1/1019; H03M 1/1047; H03M 1/1061; H03M 1/122; H03M 1/1225; H03M 1/123; H03M 1/1235; H03M 1/14; H03M 1/181; H03M 1/188; H03M 1/20; H03M 1/403; H03M 1/70; H03M 1/74; H03M 3/342; H03M 3/426; H03M 3/458; H03F 3/45475; H03F 1/0205;

(Continued)

(56) References Cited

U.S. PATENT DOCUMENTS

| | | | | | |
|---|---|---|---|---|---|
| 4,350,975 | A | * | 9/1982 | Haque ..................... | H03M 1/06 |
| | | | | | 341/172 |
| 5,432,514 | A | * | 7/1995 | Mukuda .............. | H03M 1/1076 |
| | | | | | 341/120 |

(Continued)

*Primary Examiner* — Linh V Nguyen
(74) *Attorney, Agent, or Firm* — NIXON PEABODY LLP

(57) ABSTRACT

A low power high bandwidth analog to digital converter system is disclosed. A first analog signal input receives an input signal. A first programmable gain amplifier receives the input signal. An analog to digital converter (ADC) is coupled to the output of the first programmable gain amplifier and samples the input signal for conversion to a digital signal. A controller is coupled to the ADC and the first programmable gain amplifier. The controller selects and enables either a reduced power mode or a power up mode for the first programmable gain amplifier and the ADC. The power up mode is selected and enabled when the input signal is to be sampled to operate the first programmable gain amplifier and the ADC to sample the input signal.

19 Claims, 7 Drawing Sheets

300

(51) Int. Cl.
    *H03M 1/12*      (2006.01)
    *H03M 1/18*      (2006.01)
    *H03M 1/46*      (2006.01)

(52) U.S. Cl.
    CPC ......... *H03M 1/1205* (2013.01); *H03M 1/183*
    (2013.01); *H03M 1/462* (2013.01)

(58) Field of Classification Search
    CPC .... H03F 1/0261; H03F 1/526; H03F 2200/03;
         H03F 2200/129; H03F 2200/294; H03F
         2200/451; H03F 2203/45116; H03F
         2203/45512; H03F 2203/45528; H03F
         2203/45544; H03F 2203/45616; H03F
         2203/7236; H03F 3/187; H03F 3/189;
         H03F 3/191; H03F 3/193; H03F 3/2173;
         H03F 3/2175; H03F 3/45479
    USPC ................ 341/155, 118, 120, 121, 140, 142
    See application file for complete search history.

(56)           References Cited

U.S. PATENT DOCUMENTS

| 5,675,337 | A | * | 10/1997 | Moriyama | .............. | H03M 1/12 |
|---|---|---|---|---|---|---|
| | | | | | | 341/155 |
| 5,963,843 | A | * | 10/1999 | Sit | ............ | H03F 1/526 |
| | | | | | | 725/144 |
| 6,476,745 | B1 | * | 11/2002 | Evans | ................. | H04B 14/046 |
| | | | | | | 341/139 |
| 6,621,433 | B1 | * | 9/2003 | Hertz | ................ | G01R 33/3621 |
| | | | | | | 324/309 |
| 6,748,200 | B1 | * | 6/2004 | Webster | ................ | H03D 3/008 |
| | | | | | | 375/345 |
| 7,009,537 | B2 | * | 3/2006 | Kabune | .............. | H03M 1/1076 |
| | | | | | | 341/120 |
| 7,120,655 | B2 | * | 10/2006 | Liang | ................ | H03H 17/0261 |
| | | | | | | 708/300 |
| 7,400,283 | B1 | * | 7/2008 | Zhu | .................... | H03M 1/1225 |
| | | | | | | 341/122 |
| 7,656,970 | B1 | * | 2/2010 | Sankabathula | ....... | H04L 43/024 |
| | | | | | | 375/316 |
| 8,816,886 | B1 | * | 8/2014 | Warner | .............. | H03M 1/1057 |
| | | | | | | 341/120 |
| 9,703,313 | B2 | | 7/2017 | Sheafor | | |
| 9,755,585 | B1 | * | 9/2017 | Klein | ................... | H03F 1/0227 |
| 9,772,648 | B2 | | 9/2017 | Sheafor | | |
| 9,880,583 | B2 | | 1/2018 | Sheafor | | |
| 9,939,839 | B2 | | 4/2018 | Sheafor | | |
| 10,338,632 | B2 | | 7/2019 | Hanson | | |
| 10,489,069 | B2 | | 11/2019 | Carlough | | |
| 10,578,656 | B2 | | 3/2020 | Hanson | | |
| 10,754,414 | B2 | | 8/2020 | Hanson | | |
| 10,931,298 | B2 | * | 2/2021 | Kim | ...................... | H03M 1/466 |
| 11,790,931 | B2 | | 10/2023 | Serwy | | |
| 2006/0044170 | A1 | * | 3/2006 | Boemler | .............. | H03M 1/403 |
| | | | | | | 341/155 |
| 2010/0250856 | A1 | | 9/2010 | Owen | | |
| 2011/0080925 | A1 | * | 4/2011 | Molina | .............. | H03M 1/0872 |
| | | | | | | 370/538 |
| 2012/0084589 | A1 | | 4/2012 | Millet | | |
| 2012/0303897 | A1 | | 11/2012 | Pullagoundapatti | | |
| 2014/0059371 | A1 | | 2/2014 | Kitchin | | |
| 2014/0101370 | A1 | | 4/2014 | Chu | | |
| 2014/0136870 | A1 | | 5/2014 | Breternitz | | |
| 2014/0208144 | A1 | | 7/2014 | Ma | | |
| 2015/0237583 | A1 | * | 8/2015 | Hassan | ................... | H04B 1/40 |
| | | | | | | 455/552.1 |
| 2017/0053689 | A1 | | 2/2017 | Noguchi | | |
| 2017/0206031 | A1 | | 7/2017 | Yin | | |
| 2018/0293011 | A1 | | 10/2018 | Schluessler | | |
| 2018/0349266 | A1 | | 12/2018 | Canepa | | |
| 2019/0042157 | A1 | | 2/2019 | Bonen | | |
| 2019/0146695 | A1 | | 5/2019 | Kim | | |
| 2020/0333386 | A1 | * | 10/2020 | Bennett | ................ | G01R 21/133 |
| 2022/0045658 | A1 | * | 2/2022 | Zhang | ................... | H03M 1/185 |
| 2022/0130405 | A1 | | 4/2022 | Serwy | | |
| 2022/0342729 | A1 | | 10/2022 | Cai | | |
| 2024/0128981 | A1 | * | 4/2024 | Kobayashi | ............ | H03M 1/183 |

* cited by examiner

APB

AXI

170

System
SRAM
(1MB)

Graphics

174

Display

172

DSI

300

LOW POWER AND WIDE DYNAMIC RANGE ANALOG-TO-DIGITAL CONVERTER

PRIORITY CLAIM

The present disclosure claims the benefit of and priority to U.S. Provisional Ser. No. 63/277,159, filed Nov. 8, 2021. The contents of that application are hereby incorporated in their entirety.

TECHNICAL FIELD

The present disclosure relates generally to system on chip microcontrollers. More particularly, aspects of this disclosure relate to a very low power microcontroller system including a low power analog-to-digital converter; a negative temperature coefficient buck converter; low power components; security components; and energy monitoring components.

BACKGROUND

In recent years, due to the growth of portable electronics, there has been a push to decrease the power used by microcontrollers (or "MCU"), microprocessors, application processors, digital signal processors (DSPs), neural processing units (NPUs), and other circuits used in portable electronic appliances. With lower power requirements, effective electronics operation time can be extended, or alternatively, smaller batteries can be used. Commonly, the power consumption of a microcontroller and associated circuits may be reduced by using a lower supply voltage, or by reducing the amount of internal capacitance being charged and discharged during the operation of the circuit.

One method for reducing microcontroller power relies on hardware or software-based power mode switching. Power modes can be selected for microcontroller components or resources based on operating state, operating conditions, and/or sleep cycle characteristics and other factors to configure low power modes for selected microcontroller components at the time the processor enters a low power or sleep state. In some systems, a set of predefined low power configurations can be used, while more sophisticated systems can dynamically select low power configurations to maximize power savings while still meeting system latency requirements.

However, even with available low power modes, microcontroller power usage can be adversely affected by interactions with connected sensors, memory systems, or other peripherals. Frequent interrupts or requests for service from such peripherals can greatly limit the time a microcontroller can remain in a low power mode. Systems that provide a reliable overall power management protocol and components for very low power operation are still needed.

SUMMARY

The term embodiment and like terms are intended to refer broadly to all of the subject matter of this disclosure and the claims below. Statements containing these terms should be understood not to limit the subject matter described herein or to limit the meaning or scope of the claims below. Embodiments of the present disclosure covered herein are defined by the claims below, not this summary. This summary is a high-level overview of various aspects of the disclosure and introduces some of the concepts that are further described in the Detailed Description section below. This summary is not intended to identify key or essential features of the claimed subject matter; nor is it intended to be used in isolation to determine the scope of the claimed subject matter. The subject matter should be understood by reference to appropriate portions of the entire specification of this disclosure, any or all drawings and each claim.

One disclosed example is a low power analog to digital converter system. The system includes a first analog signal input receiving an input signal. A first programmable gain amplifier receives the input signal. An analog to digital converter (ADC) is coupled to an output of the first programmable gain amplifier and provides a digital output signal. A controller is coupled to the first programmable gain amplifier and the ADC. The controller selects and enables either a reduced power mode or a power up mode for the first programmable gain amplifier and the ADC. The power up mode is selected and enabled when the input signal is to be sampled to operate the first programmable gain amplifier and the ADC to sample the input signal.

In another disclosed implementation of the example system, the reduced power mode includes one of: providing a low voltage to at least one of the first programmable gain amplifier and ADC, where the low voltage is lower than a voltage for the power up mode; or power gating at least one of the first programmable gain amplifier and ADC. In another disclosed implementation, the converter system is integrated into a system on chip. In another disclosed implementation, the system further includes an anti-aliasing filter coupled between the output of the first programmable gain amplifier and the ADC. In another disclosed implementation, the converter system further includes a second analog input; and a multiplexer having inputs coupled to the first and second analog inputs. The multiplexer is controlled by the controller to route the first or second analog inputs to the ADC as two separate channels. In another disclosed implementation, the controller is software executed by a general processor. In another disclosed implementation, the controller is an integrated circuit. In another disclosed implementation, the ADC is a successive approximation register (SAR) ADC. In another disclosed implementation, the converter system includes a buffer coupled between the output of the first programmable gain amplifier and the ADC. The buffer has a high bandwidth to enable fast settling of the input signal. The controller selects and enables the power up mode for the buffer when the input signal is to be sampled. In another disclosed implementation, the controller controls power to the ADC to enter the reduced power mode between each sample from the first analog input. In another disclosed implementation, the controller is operable to change the gain of the first programmable gain amplifier based on synchronization to sampling of the input signal by the ADC. In another disclosed implementation, the converter system includes a comparator coupled to the output of the programmable gain amplifier. The comparator detects when an input signal is above a wake up threshold. The controller wakes the ADC based on the output of the comparator detecting the input signal is above the wake up threshold. In another disclosed implementation, the converter system further includes a second programmable gain amplifier coupled to the first analog input. The second programmable gain amplifier has a low gain for signals that will not cause saturation of the ADC. The first programmable gain amplifier is set for a higher gain value to detect smaller amplitude signals. The ADC provides outputs from the first and second programmable gain amplifiers. The controller selects the ADC output from either the first or second programmable gain amplifier. In another disclosed implementation, the converter system includes a second programmable gain amplifier coupled to the first analog input. The second programmable gain amplifier has a gain equivalent to a gain of the first programmable gain amplifier. The controller averages the outputs of the ADC from the first and second programmable gain amplifiers. In another disclosed implementation, the first analog input is coupled to an audio microphone. In another disclosed implementation, the first analog input is coupled to an analog sensor of one of the group consisting of temperature sensors, light sensors, biosensors, battery voltage level sensors, touch sensors, force sensors, and strain sensors.

Another disclosed example is a system on chip for audio processing. The system on chip has an audio data input receiving an audio input signal and a first programmable gain amplifier receiving an audio input signal from the audio data input. An analog to digital converter (ADC) is coupled to the output of the programmable gain amplifier and provides a digital output signal. A controller is coupled to the first programmable gain amplifier and ADC. The controller selects and enables either a reduced power mode or a power up mode for the first programmable gain amplifier and the ADC. The power up mode is selected and enabled when the audio input signal is to be sampled to operate the first programmable gain amplifier and the ADC to sample the audio input signal.

BRIEF DESCRIPTION OF THE DRAWINGS

The disclosure will be better understood from the following description of exemplary embodiments together with reference to the accompanying drawings, in which:

FIG. 1A-1B is a block diagram of the example low power microcontroller system;

Figure 1A:
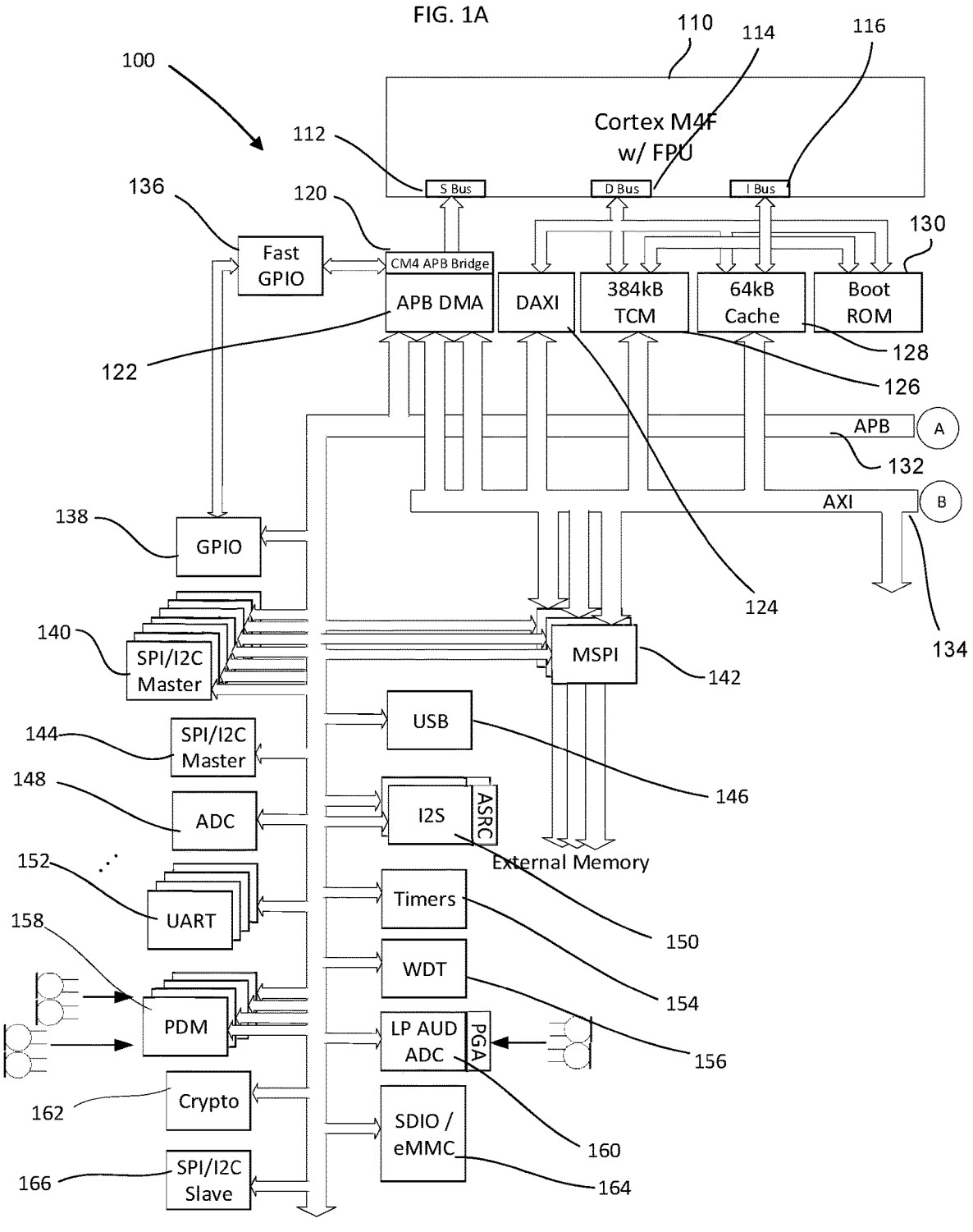

The present disclosure is susceptible to various modifications and alternative forms. Some representative embodiments have been shown by way of example in the drawings and will be described in detail herein. It should be understood, however, that the invention is not intended to be limited to the particular forms disclosed. Rather, the disclosure is to cover all modifications, equivalents, and alternatives falling within the spirit and scope of the invention as defined by the appended claims.

DETAILED DESCRIPTION OF THE ILLUSTRATED EMBODIMENTS

The present inventions can be embodied in many different forms. Representative embodiments are shown in the drawings, and will herein be described in detail. The present disclosure is an example or illustration of the principles of the present disclosure, and is not intended to limit the broad aspects of the disclosure to the embodiments illustrated. To that extent, elements and limitations that are disclosed, for example, in the Abstract, Summary, and Detailed Description sections, but not explicitly set forth in the claims, should not be incorporated into the claims, singly or collectively, by implication, inference, or otherwise. For purposes of the present detailed description, unless specifically disclaimed, the singular includes the plural and vice versa; and the word "including" means "including without limitation." Moreover, words of approximation, such as "about," "almost," "substantially," "approximately," and the like, can be used herein to mean "at," "near," or "nearly at," or "within 3-5% of," or "within acceptable manufacturing tolerances," or any logical combination thereof, for example.

The present disclosure is directed toward an example low power microcontroller system. The example microcontroller system includes a low power and wide dynamic range analog-to-digital converter. A negative temperature coefficient buck converter rail using a 1T subthreshold voltage reference is also provided. The microprocessor on the example low power microcontroller system includes an embedded secure boot and cryptographic function. A low power and high performance serial interface is provided. The example microcontroller system also includes a flexible and low power cache memory architecture.

Figure 1B:
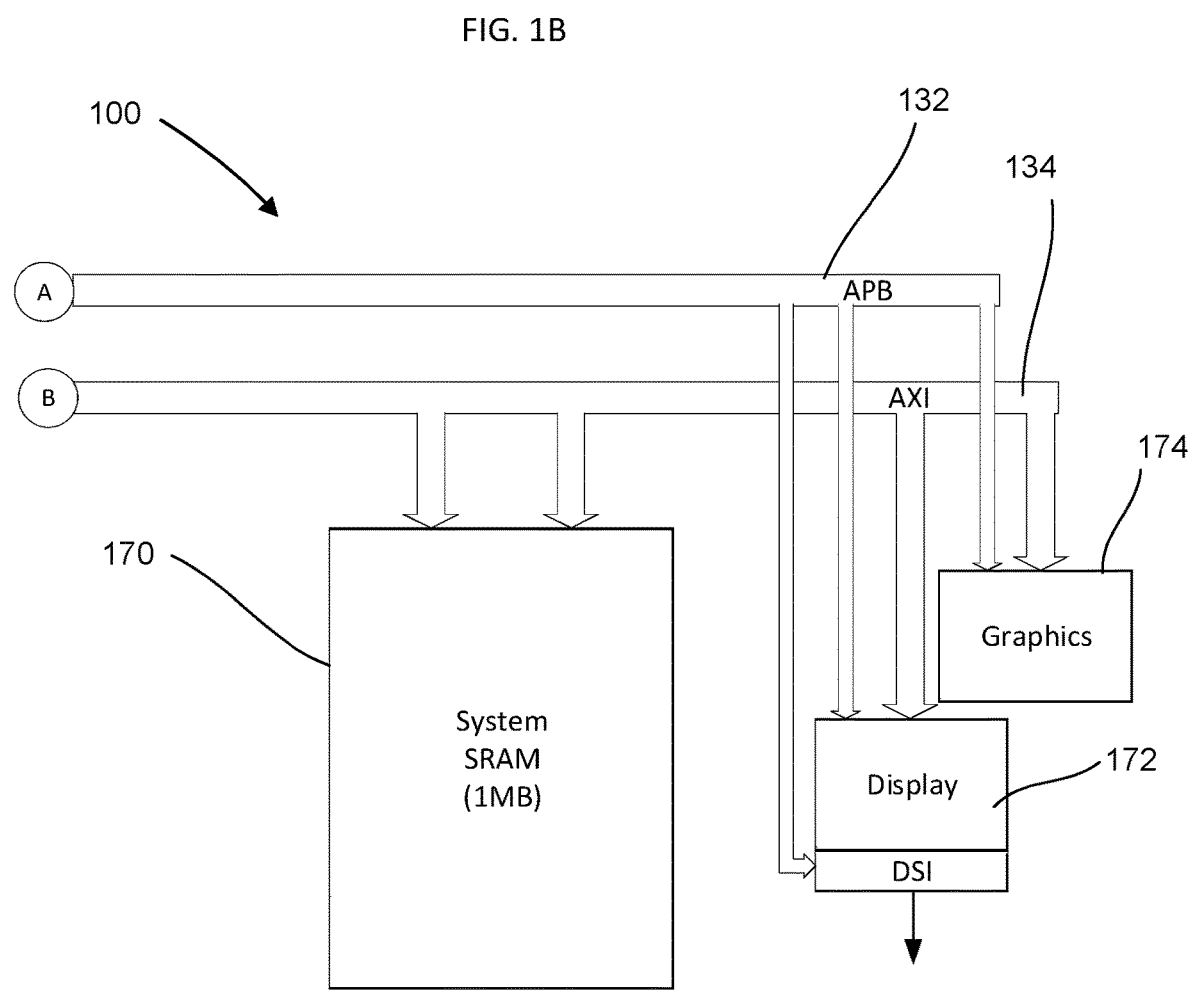

FIGS. 1A-1B are a block diagram of an example low power microcontroller system 100. The example low power microcontroller system 100 includes a central processing unit (CPU) 110. The CPU 110 in this example is Cortex M4F (CM4) with a floating point unit. The CPU 110 includes a System-bus interface 112, a Data-bus interface 114, an Instruction-bus) interface 116. It is to be understood, that other types of general CPUs, or other processors such as DSPs or NPUs may incorporate the principles described herein.

The System-bus interface 112 is coupled to a Cortex CM4 advanced peripheral bus (APB) bridge 120 that is coupled to an advanced peripheral bus (APB) direct memory access (DMA) module 122. The microcontroller system 100 includes a Data Advanced eXtensible Interface (DAXI) 124, a tightly coupled memory (TCM) 126, a cache 128, and a boot ROM 130. The Data-bus interface 114 allows access to the DAXI 124, the TCM 126, the cache 128, and the boot read only memory (ROM) 130. The Instruction-bus interface 116 allows access to the TCM 126, the cache 128, and the boot ROM 130. In this example, the DAXI interface 124 provides write buffering and caching functionality for the microcontroller system 100. The DAXI interface 124 improves performance when accessing peripherals like the SRAM and the MSPIs.

An APB 132 and an Advanced eXtensible Interface (AXI) bus 134 are provided for communication between components on the microcontroller system 100. The APB (Advanced Peripheral Bus) is a low speed and low overhead interface that is used for communicating with peripherals and registers that don't require high performance and don't change often (e.g., when a controller wants to set configuration bits for a serial interface. The AXI bus 134 is an ARM standard bus protocol that allows high speed communications between multiple masters and multiple busses. This is useful for peripherals that exchange a lot of data (e.g., a controller that talks to an ADC and needs to transfer ADC readings to a microcontroller or a GPU that talks to a memory and needs to transfer a large amount of graphics data to/from memories).

A fast general purpose input/output (GPIO) module 136 is coupled to the APB bridge 120. A GPIO module 138 is coupled to the fast GPIO module 136. The APB bus 132 is coupled to the GPIO module 138. The APB bus 132 is coupled to a series of Serial Peripheral Interface/Inter-Integrated Circuit (SPI/I2C) interfaces 140 and a series of Multi-bit Serial Peripheral Interfaces (MSPI)s 142. The MSPIs 142 are also coupled to the AXI bus 134 and provide access to external memory devices.

The APB bus 132 also is coupled to a SPI/I2C interface 144, a universal serial bus (USB) interface 146, an analog to digital converter (ADC) 148, an Integrated Inter-IC Sound Bus (I2S) interface 150, a set of Universal Asynchronous Receiver/Transmitters (UART)s 152, a timers module 154, a watch dog timer circuit 156, a series of pulse density modulation (PDM) interfaces 158, a low power audio ADC 160, a cryptography module 162, a Secure Digital Input Output/Embedded Multi-Media Card (SDIO/eMMC) interface 164, and a SPI/I2C slave interface module 166. The PDM interfaces 158 may be connected to external digital microphones. The low power audio ADC 160 may be connected to an external analog microphone through internal programmable gain amplifiers (PGA).

A system static random access memory (SRAM) 170, which is 1 MB in this example, is accessible through the AXI bus 134. The microcontroller system 100 includes a display interface 172 and a graphics interface 174 that are coupled to the APB bus 132 and the AXI bus 134.

Components of the disclosed microcontroller system 100 are further described by U.S. Provisional Ser. No. 62/557,534, titled "Very Low Power Microcontroller System," filed Sep. 12, 2017; U.S. application Ser. No. 15/933,153, filed Mar. 22, 2018 titled "Very Low Power Microcontroller System," (Now U.S. Pat. No. 10,754,414), U.S. Provisional Ser. No. 62/066,218, titled "Method and Apparatus for Use in Low Power Integrated Circuit," filed Oct. 20, 2014; U.S. application Ser. No. 14/855,195, titled "Peripheral Clock Management," (Now U.S. Pat. No. 9,703,313), filed Sep. 15, 2015; U.S. application Ser. No. 15/516,883, titled "Adaptive Voltage Converter," (Now U.S. Pat. No. 10,338,632), filed Sep. 15, 2015; U.S. application Ser. No. 14/918,406, titled "Low Power Asynchronous Counters in a Synchronous System," (Now U.S. Pat. No. 9,772,648), filed Oct. 20, 2015; U.S. application Ser. No. 14/918,397, titled "Low Power Autonomous Peripheral Management," (Now U.S. Pat. No. 9,880,583), filed Oct. 20, 2015; U.S. application Ser. No. 14/879,863, titled "Low Power Automatic Calibration Method for High Frequency Oscillators," (Now U.S. Pat. No. 9,939,839), filed Oct. 9, 2015; U.S. application Ser. No. 14/918,437, titled "Method and Apparatus for Monitoring Energy Consumption," (Now U.S. Pat. No. 10,578,656), filed Oct. 20, 2015; U.S. application Ser. No. 17/081,378, titled "Improved Voice Activity Detection Using Zero Crossing Detection," filed Oct. 27, 2020, U.S. application Ser. No. 17/081,640, titled "Low Complexity Voice Activity Detection Algorithm," filed Oct. 27, 2020, all of which are hereby incorporated by reference.

Low Power and Wide Dynamic Range Analog-to-Digital Converter

One aspect of the microcontroller system 100 is the low power and wide dynamic range audio analog-to-digital converter (ADC) 160 in FIG. 1A. Battery-powered devices like smartwatches and headphones integrate an increasing number of sensors. Many of these sensors, like accelerometers, gyroscopes, pressure sensors, light sensors, temperature sensors, touch sensors, biosensors, image sensors, and microphones integrate both a transducer and an analog-todigital converter (ADC) and provide a digital output that can be sent to a host processor over a serial interface. However, sometimes these sensors generate analog signals that must be converted to digital values by an ADC inside the host processor or system on chip itself. In battery-powered devices, it is beneficial to use ADCs that require extremely little power to operate. Normally, achieving low power requires a compromise on other performance parameters like dynamic range. The example low power ADC 160 relates to ADC architectures and related algorithms that can simultaneously achieve both low power and high dynamic range by combining multiple samples of the analog signal amplified by different amounts using one or more low power ADCs with limited dynamic range. This method is also known as Dynamic Range Extension (DRE).

Figure 2:
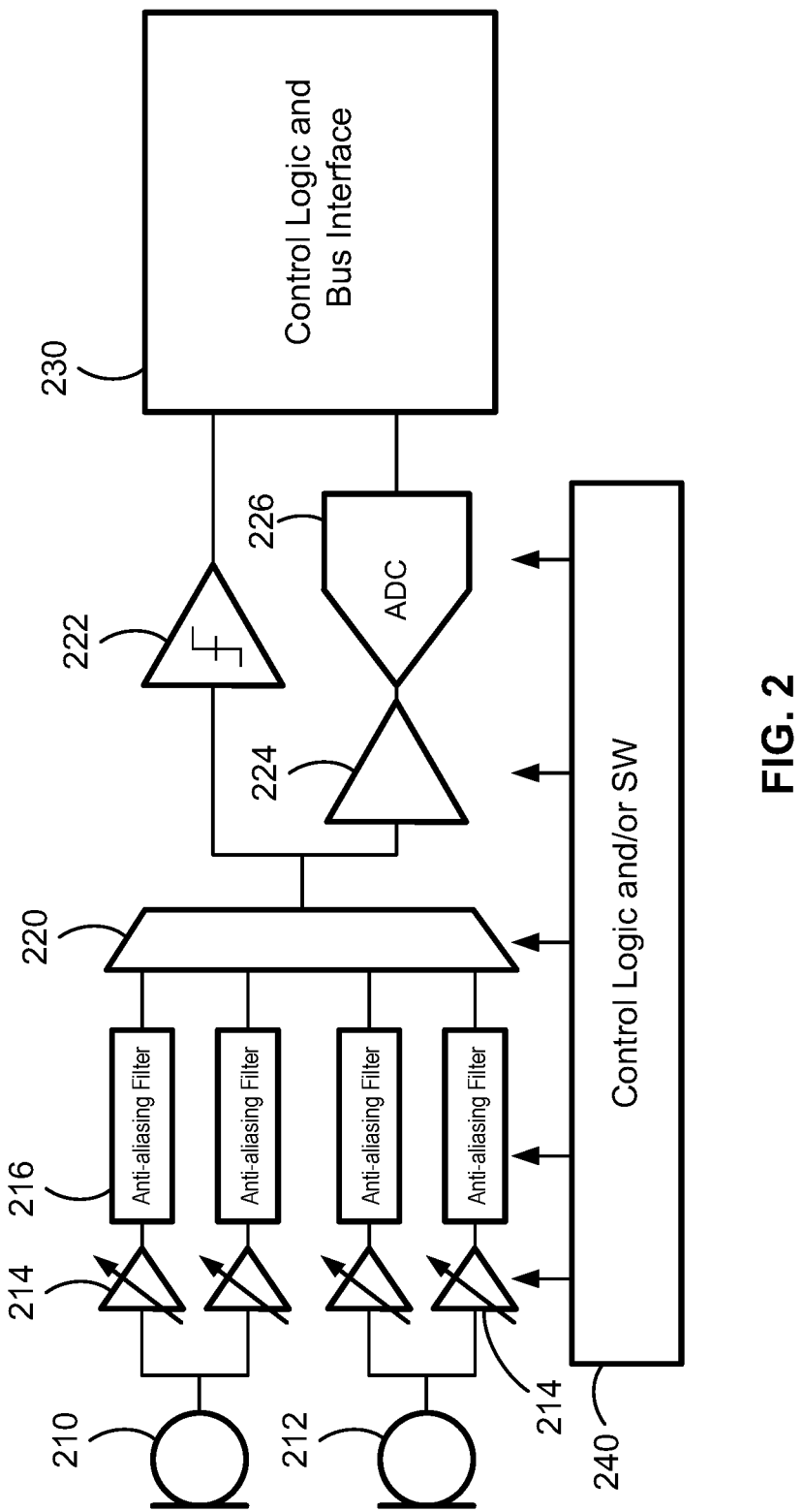
FIG. 2 is a block diagram of an example low power analog to digital converter in the low power microcontroller system in FIG. 1.

FIG. 2 shows an ADC architecture 200 of the low power ADC 160 that is capable of low power and high dynamic range operation. Though any analog sensor can be used, FIG. 2 shows an example pair of analog microphones 210 and 212 coupled to a series of programmable gain amplifiers 214. Other possible analog sensors include, but are not limited to, temperature sensors, light sensors, biosensors, battery voltage level sensors, touch sensors, force sensors, strain sensors, and any other sensor that provides an analog voltage or current to be measured. The outputs of the programmable gain amplifiers 214 are coupled to anti-aliasing filters 216, which are in turn coupled to the inputs of a multiplexer 220. The multiplexer 220 can select one input at a time to be routed to an output. The output of the multiplexer 220 is coupled to a comparator 222 and a buffer 224. The output from the buffer 224 is coupled to an ADC 226. The outputs of the ADC 226 and the comparator 222 are coupled to a control logic and bus interface 230 that allows the converted signal to be communicated to downstream components for further processing. All circuits such as the programmable amplifiers 214, filters 216, and multiplexer 220 are connected to control signals generated by a controller module 240. The controller module 240 may be implemented as either hardware-based logic or software. The following discussion describes variants of the ADC architecture 200 that includes some or all of these components.

In one variant of the example ADC architecture 200, at least one amplifier with programmable gain such as the programmable gain amplifiers 214 and one or more of the anti-aliasing filters 216 are coupled to the ADC 226 through the input buffer 224. In this example, the ADC 226 is preferably a successive approximation register (SAR) ADC, although other ADC architectures can be used. The input buffer 224 is designed to have a high bandwidth to enable fast settling and is enabled only during a short tracking window (e.g., 0.5 µs). The ADC 226, input buffer 224, and related circuitry can be placed in a reduced power mode for most of the time, and then may only briefly be powered up in a normal operation mode during sampling of the input signal. The reduced power mode may be a low power mode or a power gated mode. The power gated mode that toggles off power can be achieved in a variety of ways. For example, a power switch can be inserted in series with the relevant component and toggled based on the power state. In another example, bias currents provided to amplifiers and other sub-components can be turned off.

The low power mode can also be achieved in a variety of ways. For example, voltages for the relevant component can be reduced (e.g., from a nominal 1.8V during normal operation mode to 1.2V during a low power mode) to minimize standby power. In another example, bias currents provided to amplifiers and other sub-components can be reduced (e.g., from 1 nA to 100 pA) to save operating power. Further, the voltage may be fixed, but the active signal may be pulsed, bringing the buffer out of standby thereby consuming current and operating as a buffer. This enables considerably lower power consumption than converters in which the circuitry remains powered up in a normal operation mode at all times.

Two or more inputs may be coupled to the ADC 226 through a multiplexer such as the multiplexer 220. The control logic or software of the controller module 240 can select one input at a time and then provide the selected input to the ADC 226 for sampling. If the ADC 226 runs at a sufficiently high sampling rate, then multiple channels can be similarly sampled at high rates. For example, in the case of 8 channels being sampled at 48 kilosamples per second (kSps) each, a Nyquist rate ADC like a SAR ADC could cycle through each of the 8 channels by running at an aggregate sampling rate of 384 kSps. In this example, the ADC 226 runs continuously and remains constantly powered on. Alternatively, the ADC 226 could sample at an even higher sampling rate while maintaining the same 48 kSps sampling rate per channel and then transition to low power or power gated mode between each conversion (along with any coupled buffers or other circuitry). For example, at an aggregate sampling rate of 3 Msps, the ADC 226 requires only 2.7 μs (plus transition time) to sample all 8 channels. Sampling all 8 channels 48,000 times per second requires only 0.13 s in total. The ADC 226 and related circuitry can thus be placed into a low power or power gated mode between samples, for a total of (1–0.13)=0.87 s in low power mode.

It is desirable for the gain on the amplifiers 214 to be changed dynamically to maximize dynamic range and for a variety of other reasons. However, ADC output characteristics can be corrupted if this gain change is handled in the wrong way. For example, if the ADC is monitoring a microphone, changing gain at the wrong time can lead to the introduction of pop and click sounds in the digital audio stream output by the ADC. It is therefore critical to change gain in a controlled manner. This can be done by synchronizing gain changes to ADC samples and conditions. For example, gain may be changed only when the signal value is at or around a zero value (i.e., zero detection). Alternatively, gain could be changed once the output is detected to be saturated or near saturation (i.e., saturation detection). A set threshold or multiple set thresholds could also be used to detect the correct time to change gain (i.e., a comparison operation or a window comparison operation). In all cases, it is desirable to change gain between ADC sampling operations to avoid disrupting the analog-to-digital conversion event. The gain adjustment process can be controlled by dedicated control logic (which generally offers minimum power at the expense of flexibility) or by software (which offers flexibility at the expense of power). In an ADC architecture containing multiple channels and multiple amplifiers, such as in a two-microphone (210 and 212) beamforming application, the gain of each amplifier for a channel is preferred to be independent but can also be shared between channels.

Sharing the gain is useful when multiple microphones are used in conjunction with automatic gain control (AGC). AGC is required to counter gradual or sudden changes in the acoustic environment, such as movement of a sound source, or displacement of the microphone array in relation to the sound source, or addition of an alternate sound source that creates unwanted "noise." By using AGC, signal quality is improved without the risk of clipping, by dynamically adjusting gain in response to the converted signal. Signal quality is increased further using multiple microphones and beamforming, which improves directionality in acoustic environments that can benefit from directionality, e.g. when the unwanted noise source is spatially separated from the desired sound source.

It is particularly desirable to change gain when the output is close to saturating (i.e., when the ADC output value is close to the maximum or minimum value detectible by the ADC). It is preferable to have a "fast attack" automatic gain control methodology in which the gain is changed as quickly as possible once saturation is detected as happening or imminently happening. The fast attack can be achieved either through hardware logic control or via software control. If it is handled via software control, it is desirable for a saturation detector hardware block to trigger an interrupt signal which is monitored by a power management unit or interrupt management unit that causes a host MCU to execute software (e.g., an interrupt handler and related code) to quickly adjust gain. To minimize the response time, and ensure a fast attack, the interrupt can be treated as a high priority interrupt relative to other interrupts in the system. A fast attack automatic gain control methodology is often coupled with a "slow release" in which the gain is returned to its previous state before saturation after significant time spent below or above the saturation threshold. A fast attack coupled with a slow release ensures safe operation and can avoid saturation entirely.

In another variant, one or more anti-aliasing filter outputs can be coupled to a comparator 222 with programmable threshold (in addition to or instead of the ADC). Alternatively, other filters may also be coupled to the comparator with a programmable or set threshold. Comparators generally consume far less power than ADCs, so it may be desirable to use the comparator to monitor input levels for most of the time and then only wake up the ADC when a signal of interest is detected by the comparator. For example, the comparator 222 can monitor microphone signal levels with very little power when there is silence or little sound. Significant sound or a voice causes the microphone signal to change significantly. This change causes the comparator 222 output to flip. Control logic or software can then automatically enable the ADC to begin sampling at high frequency. In one example, the changing of the comparator output causes an interrupt signal to change state. That interrupt signal is monitored by a power management unit or interrupt management unit that causes a host MCU to execute software (e.g., an interrupt handler and related code) that moves the ADC from a power gated or low power operating mode to a normal operating mode that is capable of sampling at high frequency.

In another variant of the ADC architecture 200, an input channel may be monitored by at least two programmable gain amplifiers such as the programmable gain amplifiers 214 coupled to the analog input 210. When desirable, the two or more programmable gain amplifiers 214 can monitor the input channel with similar or different gain settings to achieve multiple possible benefits. For example, the dynamic range of the ADC 226 can be extended by monitoring the input channel at two different gain levels. A first amplifier 214 can be set to a low gain value that is unlikely to cause saturation on the ADC 226, and a second amplifier 214 can be set to a higher gain value that can detect signals with smaller amplitude but is at risk of causing saturation in the ADC 226. The ADC 226 can convert the outputs of both amplifiers 214 to a digital value (a first output coming from the first amplifier and a second output coming from the second amplifier), and then a hardware control block or software-based algorithm can choose the desired digital output (a first digital output from the first amplifier and a second digital output from the second amplifier) based on some criteria. For example, if the first amplifier is set at a low gain value and the second amplifier is set at a high gain value, a hardware control block or software-based algorithm might preferably choose the output of the second amplifier as long as that amplifier was not causing the output of the ADC to saturate (or come close to saturating). If saturation of the ADC (or near saturation of the ADC) is detected, then the hardware control block or software-based algorithm can choose the output of the first amplifier.

In another example, the dynamic range of the ADC 226 can be extended by monitoring the input channel with two or more different amplifiers 214 at the same gain level. The hardware control block or software-based algorithm 240 can set the gains on two or more amplifiers 214 to be identical. The ADC 226 can convert the output of each amplifier 214 to two or more digital values, and then these digital values can be used by control logic or a SW-based algorithm (e.g., running on an MCU core) to calculate a single value with higher dynamic range than any of the amplifiers could achieve alone. For example, the average of the two or more digital values offers a higher dynamic range than the digital values from a single amplifier. The calculation (e.g., the averaging) can be accomplished with either hardware logic or software running on a processor.

The use of at least two programmable gain amplifiers to monitor a single input channel can also be used to reduce DC offset or DC gain error. Using several samples from a moderately time-varying input signal, the DC offset of each channel can be computed by low-pass filtering the digital samples, since the input voltage signal has zero DC offset when AC coupled to the input of the PGA. The relative gain G between the two channels CH_0[n] and CH_1[n] can be computed by ensuring:

$$G*(CH\_0[n]-DC\_0)=(CH\_1[n]-DC\_1)$$

where the DC_0 and DC_1 represent the estimates of the DC offset of CH_0 and CH_1, respectively. The value of G may also be iteratively computed to minimize the error:

$$E=G*(CH\_0[n]-DC\_0)-(CH\_1[n]-DC\_1)$$

where G can be adjusted following the gradient of the error, which avoids using division which can be compute-intensive when compared to multiplication. The value of G, when compared to the target, nominal analog gain difference, may be used to calibrate the relative gains across various hardware gain configurations, so that actual hardware gains are known rather than the nominal gains. The programmable hardware gain operates using two separate gain stages that can be configured separately and have overlapping nominal gains. In all cases, sensor inputs and subsequent signal chains can be single-ended, pseudo-differential, or differential. Pseudo-differential or differential signals are preferred, especially in high interference environments, such as Printed Circuit Board (PCBs), wherein the low-amplitude analog microphone signal routing is susceptible to interference by other signals routed through the PCB. By using pseudo-differential or differential signaling, two traces from a microphone are routed with a matched differential pair in close proximity for the entire length of the route, and any interference induced in the differential pair appears similarly in both traces. Therefore, the common-mode interference can be canceled by the gain amplifier due to its high common mode rejection ratio (CMRR).

Negative Temperature Coefficient Buck Converter

Voltage supplies for the microcontroller system 100 require efficient voltage supply circuits to maximize power efficiency. A DC DC step down converter, alternatively called a buck converter, typically requires a voltage reference to set the DC level that a buck regulator must generate. The voltage reference may be the same as the required DC level, or an attenuated version of the required level.

Figure 3:
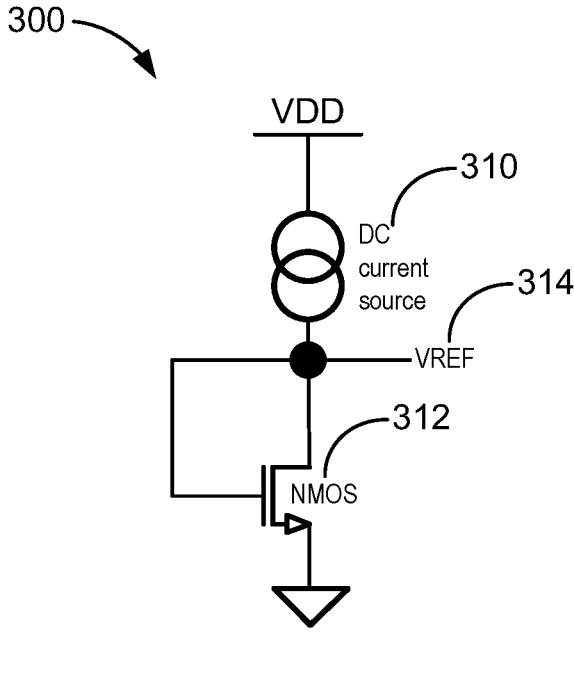
FIG. 3 is a circuit diagram of a negative temperature coefficient voltage reference source for an example buck converter.

For sub threshold operation or near-threshold operation, a negative temperature voltage rail may be used to aid circuit timing closure. FIG. 3 shows a negative temperature coefficient voltage reference circuit 300 for providing a reference voltage. The negative temperature voltage reference circuit 300 includes a DC current source 310. The DC current source 310 is coupled to a diode connected NMOS transistor 312. The circuit 300 includes a voltage reference output 314. The voltage reference output 314 couples the DC current source 310 between the gate of the NMOS 312 and the source of the NMOS 312. The reference circuit 300 is further described in U.S. Pat. No. 10,013,006, titled "LOW POWER TUNABLE REFERENCE VOLTAGE GENERATOR," hereby incorporated by reference.

The diode connected NMOS transistor 312, when operating in subthreshold, generates a Vgs voltage that decreases as temperature increases. The change in the output voltage 314 as a function of temperature (the tempco) is a function of the length of the diode connected transistor. Multiple transistors may be placed in series to form this diode transistor, and the effective diode transistor length is simply the sum of all units. By shorting across unit elements, the length can be adjusted and the tempco changed accordingly. Although an NMOS transistor 312 is used in this example, it should be understood that a circuit with a similar function may be used with a diode connected PMOS transistor with the current source going to ground. In such a PMOS based circuit, the circuit in FIG. 3 would have the PMOS transistor on top and the current source on the bottom. This creates a voltage reference relative to VDD rather than ground.

Figure 4:
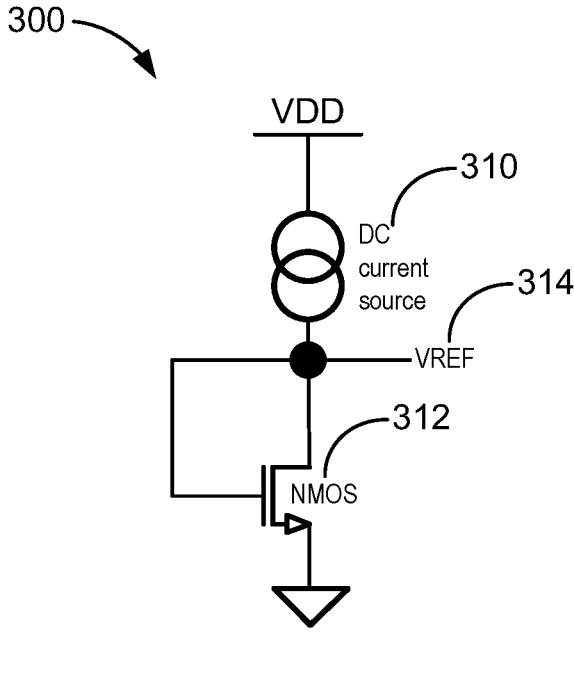
FIG. 4 is a block diagram of an example buck converter using the example negative temperature coefficient voltage reference in FIG. 3 for the example low power microcontroller system in FIG. 1.

FIG. 4 shows a circuit diagram of the negative temperature coefficient circuit 300, a programmable gain amplifier 410 with a voltage regulator 412 such as a buck converter. The negative temperature coefficient circuit 300 generates a first reference signal (Vref1) which is connected to the positive input of the gain amplifier 410. The gain amplifier 410 has an output that is a second reference signal (Vref2). The negative input of the gain amplifier 410 is tied through a first resistor 414 to ground. The output of the gain amplifier 410 is tied to one end of a second resistor 416. The other end of the second resistor 416 is also tied to the negative input of the gain amplifier 410.

The circuit in FIG. 4 allows the negative temperature coefficient circuit 300 in FIG. 3 to create a programmable negative temperature coefficient voltage reference with the gain amplifier 410 for the voltage regulator 412, which is a buck converter in this example. It is to be understood that the adjustment circuit in FIG. 4 may be used for any type of voltage regulator/converter such as a low dropout (LDO) regulator. The ratio of Vref2 to Vref1 can be adjusted via trim, by changing the values of either the second resistor 416 or the first resistor 414. In this example, the resistors 414 and 416 represent resistor network circuits that include unit resistors wired in series with switches that can short across a number of resistors. For example, one of the resistor network circuits may have 128 units each of R resistance value, with 7 switches to short out 1/2/4/8/16/32/64 units allows a resistor value of 1R to 128R to be created.

Low Power and High Performance Serial Interface

Another feature of the microcontroller system 100 is the I2C/SPI slave module 166 in FIG. 1A. The I2C/SPI Slave (IOS) module 166 provides an interface which allows an external Master (the Host) on either interface to transfer data to and from the microcontroller system 100. This data is read from or written to an internal memory within the IOS module 166. In this example, the internal memory in the IOS module 166 is 256 bytes, but other sizes of memory may be used. It is often desirable for the host to be able to transfer larger blocks of data within a single operation, and this requires special functions in the IOS module 166 because the CPU 110 of the microcontroller system 100 must move data between the small memory in the IOS module 166 and the large system memory such as the SRAM 170.

For read transfers from the microcontroller system 100 to the external Host, the IOS module 166 includes a FIFO function which tracks the number of bytes which have been transferred. The IOS module 166 may be configured to interrupt the CPU 110 when the number of bytes reaches a certain value, and software running on the CPU 110 can move additional data from the main memory to the IOS memory, effectively enabling an infinitely long transfer.

The above approach does not work for transfers from the Host to the microcontroller system 100, so an alternative implementation is provided for these write transfers. In both I2C and SPI protocols, there is an "address pointer" held in the Slave device which allows the Host to write to specific addresses. When a byte is written, the address pointer is typically automatically incremented to the next address. The address pointer is selecting a specific location within the local memory of the IOS module 166, which would normally limit the transfer to no more than the number of bytes in the local memory, which in this example is 256 bytes. However, in this example, the address pointer is written with 0 when the transfer occurs and the current address pointer contains the address of the highest byte in the memory, in this case 255. Thus the transfer wraps around, and can be infinitely long.

As with the read transfer, the CPU 110 must be interrupted within the transfer so that software can move data from the IOS local memory of the IOS module 166 to the main memory SRAM 170. Thus the disclosed microcontroller system 100 includes a mechanism which allows the IOS module 166 to be configured to generate an interrupt on writes to certain addresses, i.e., address pointer values. By allowing interrupts at multiple address pointer values to be configured, software can select how many locations in the local memory are available for Host transfers, and can thus ensure that the memory will not fill up and create an overflow condition before software can move data out of the local memory to the main memory. It is possible to allow interrupts on any address pointer value, although for logic simplification only a subset of addresses can be selected.

Slave devices often require some special address pointer locations which access hardware functions, such as generating an interrupt to the CPU 110. In the IOS memory the addresses between 0x78 and 0x7F are used for this purpose, because the SPI protocol only supports 7-bit initial address pointer values. The address pointer may be designed to wrap from 0x77 to 0x0, but that would limit the IOS local memory to 120 bytes. Since larger local memories are desired, the example IOS module 166 specifies that the address pointer increments from 0x77 to 0x80, thus bypassing the special address area. This allows any size local memory to be used while supporting transfers of any length.

Normally the address pointer directly addresses the local memory, i.e. the location in the memory where data is written is the value of the address pointer. However, since the address pointer increments from 0x77 to 0x80, a "hole" would be introduced in the local memory, which adds complexity to the software when it is transferring data to main memory. To avoid this problem, the example IOS module 166 specifies that when the address pointer is above 0x80 the location in the local memory where the data is written is the address pointer minus the number of special addresses. In the example microcontroller system 100 there are eight special addresses. This operation is referred to as address mapping. Any number of special addresses may be supported up to a limit such as 127 special addresses, as there must be at least one address which is not mapped. Note that the address mapping function is not required, and software could handle the mapping, but it simplifies this critical software.

Security Module

Figure 5:
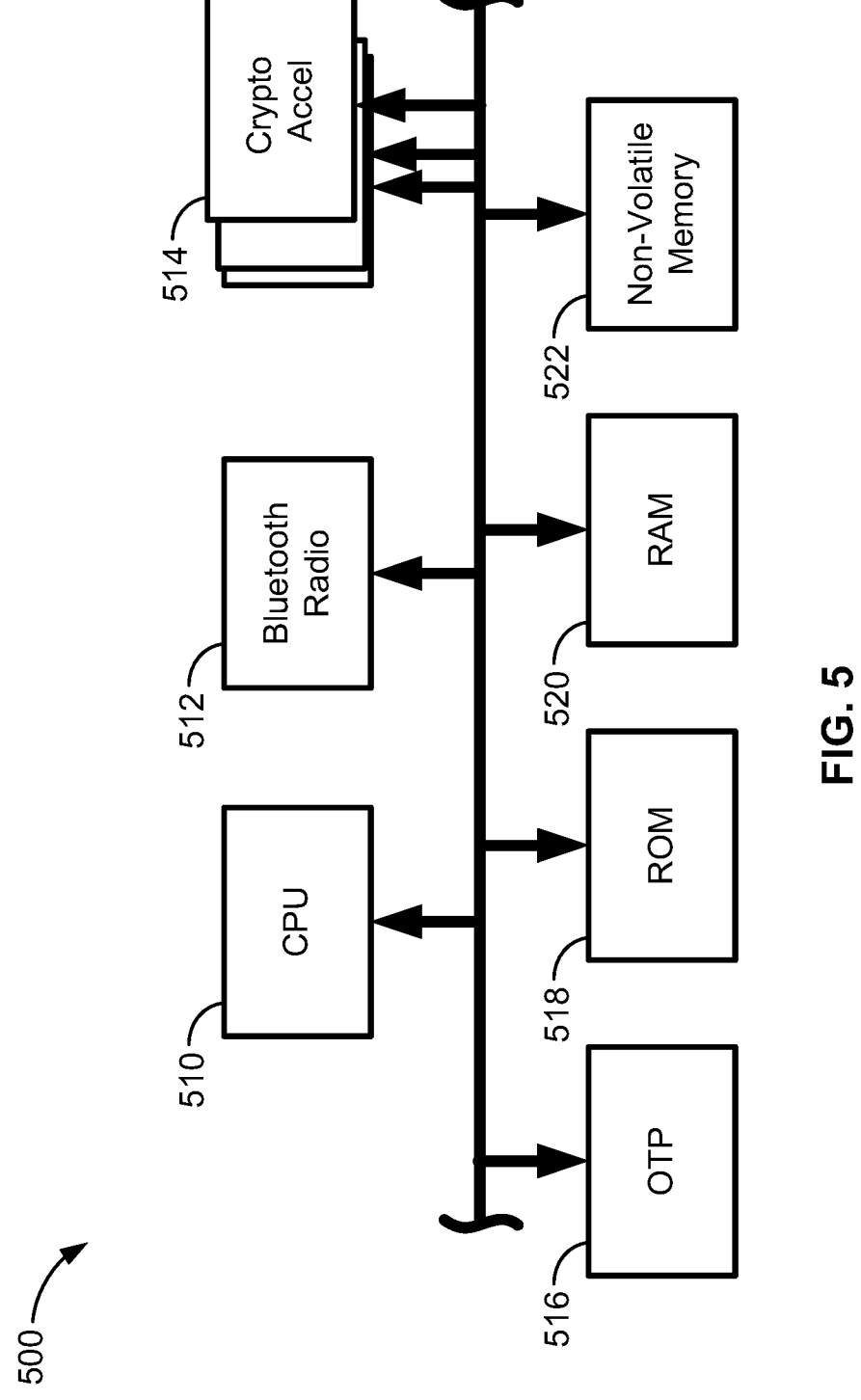
FIG. 5 is a block diagram of an example secure system for secure boot-up of the example microcontroller system in FIG. 1.

The example microcontroller system 100 includes a method and apparatus for low overhead, robust security implementation in embedded devices to support secure boot, secure debug, secure over-the-air and wired updates, secure key management and secure patching. FIG. 5 is a block diagram of a system 500 that includes a CPU 510, a Bluetooth radio 512, one or more cryptographic accelerator(s) 514, a series of one-time-programmable memory elements 516, a ROM 518, a RAM 520, and a non-volatile memory 522.

A partition of secure and non-secure is defined such that the secure partition is guaranteed secure through a series of steps to bind the environment to an established root-of-trust. The non-secure partition is assumed to be fully compromised. The maintenance of the isolation between the secure and non-secure partitions is maintained via hardware that cannot be compromised and sequences in time. At initial device boot, all external access to the processor 110 in FIG. 1 is locked via hardware locks and the processor is set into secure mode. While in secure mode, a physical hardware state is set and propagated to all elements included in or having influence on the secure boot process to indicate a secure operating mode. The CPU 510 starts execution from the ROM 518 which performs the initial system check and validates/authenticates the initial boot code called Secure Boot ROM (SBR). Once validated/authenticated to be bound to the silicon manufacturer, the CPU 510 switches execution to the SBR. The system remains in secure operating mode, allowing SBR to have access to all available assets. The SBR performs additional services to support secure debug through authentication/validation of debug certificates. Upon successful authentication/validation of debug certificate(s), the appropriate security policies are applied to the device allowing certain assets to be made available. The SBR validates/authenticates the next level firmware called a Secure Boot Loader (SBL). Upon validation/authentication, the SBR passes execution to the SBL. Prior to handoff, the operating state of the device is switched to reflect that the operating mode is still secure but is executing within a mutable environment. This allows the system resources to lock/unlock certain assets as directed by the security policy to ensure the root-of-trust is maintained.

The SBL performs additional security services such as checking for a pending over-the-air or wired firmware update. If available, the SBL performs the validation/authentication and optional decryption of the firmware updates and checks whether the installation of the new firmware is complete/successful. If the update successful, a reboot is initiated maintaining the secure operating mode and preventing any intervention.

One of the updates could be for secure patching. Secure patches can be downloaded similar to any other firmware update over-the-air or via a wired communication interface. These patches are validated/authenticated to ensure they are secure. Once validated/authenticated, the SBL performs the prescribed patch update which allows for in-the-field updates to device trim values owned by the silicon manufacturer. Once patch updates, if applicable, are complete, a device reboot is performed, again, maintaining the secure state of the device. If no patch update is required, the SBL continues to validate/authenticate the next level of firmware which can be either the secondary secure boot loader (Secondary SBL) stored in the ROM 518 or the main firmware/firmware bundle. The SBL validates/authenticates the firmware bound to the OEM root-of-trust or to the silicon manufacturer root-of-trust depending on the device configuration. This allows binding to either a separate/isolated entity or uniform entity. Upon completion, the SBL switches operating mode either to a secure OEM state (if the secondary SBL is required) or to run mode and hands off execution to the respective firmware.

The Secondary SBL can optionally perform additional firmware validation/authentication or other system security policy enforcement prior to handing off control to the executed main firmware.

During the secure boot flow, various key assets are required for validation/authentication/decryption. The keys are partitioned between silicon manufacturer assets and OEM assets. The partitioning is enforced using hardware and security state of the device such that firmware and hardware blocks requiring access are allowed and only the assets required for the specific function is allowed. All other key assets are prevented. The key assets are further cryptographically wrapped to ensure protection against probing. Key assets are also masked/destroyed as part of a debug or a Return Merchandise Authorization (RMA).

During non-boot time (runtime), a specific set of keys are made available to firmware or hardware using a separate key programmed by either the silicon manufacturer or OEM at manufacturing allowing runtime access. These key banks can further be locked from access preventing access until a reboot.

Figure 6:
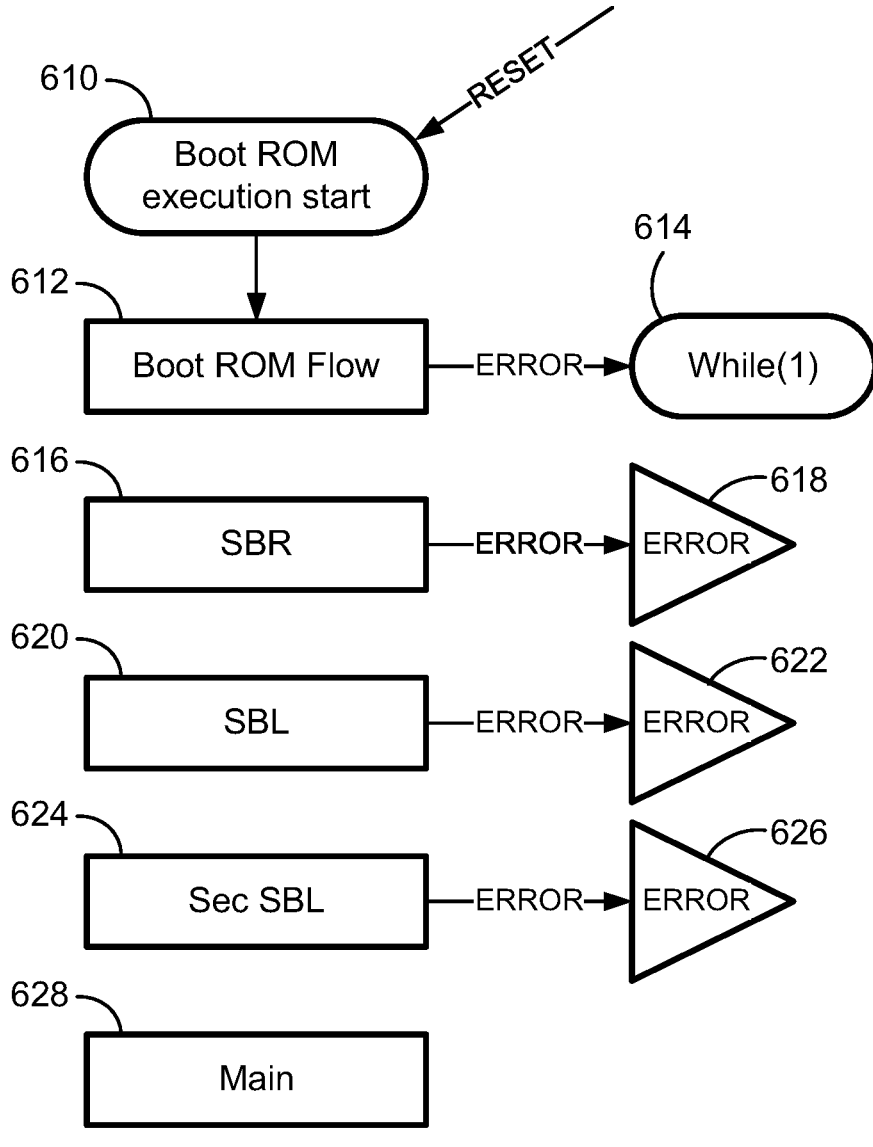
FIG. 6 is a flow diagram of the secure boot up process performed by the example microcontroller system in FIG. 1.

The flow diagram in FIG. 6 is representative of example machine readable instructions for a secure boot-up. In this example, the machine readable instructions comprise an algorithm for execution by: (a) a processor; (b) a controller; and/or (c) one or more other suitable processing device(s). The algorithm may be embodied in software stored on tangible media such as flash memory, CD-ROM, floppy disk, hard drive, digital video (versatile) disk (DVD), or other memory devices. However, persons of ordinary skill in the art will readily appreciate that the entire algorithm and/or parts thereof can alternatively be executed by a device other than a processor and/or embodied in firmware or dedicated hardware in a well-known manner (e.g., it may be implemented by an application specific integrated circuit [ASIC], a programmable logic device [PLD], a field programmable logic device [FPLD], a field programmable gate array [FPGA], discrete logic, etc.). For example, any or all of the components of the interfaces can be implemented by software, hardware, and/or firmware. Also, some or all of the machine readable instructions represented by the flowcharts may be implemented manually. Further, although the example algorithm is described with reference to the flowchart illustrated in FIG. 6, persons of ordinary skill in the art will readily appreciate that many other methods of implementing the example machine readable instructions may alternatively be used. For example, the order of execution of the blocks may be changed, and/or some of the blocks described may be changed, eliminated, or combined.

The CPU 510 starts execution from the ROM 518 (610). The initial system check occurs (612). If an error is encountered (614), the system check will repeat. If the check is successful, the validation/authentication of the SBR is performed (616). If the validation/authentication fails, the routine generates an error (618). After the SBR is successfully authenticated, execution is switched to the SBR and the system remains in secure operating mode allowing SBR to have access to all available assets. The SBR performs additional services to support secure debug through authentication/validation of debug certificates.

The SBR validates/authenticates the Secure Boot Loader (SBL) (620). If the SBL is not successfully authenticated, the routine generates an error (622). Upon successful validation/authentication, the SBR passes execution to the SBL. The SBL performs additional security services such as checking for a pending over-the-air or wired firmware update.

The SBL continues to validate/authenticate the next level of firmware such as the secondary secure boot loader (Secondary SBL) (624). Alternatively, the next level of firmware may be the main firmware/firmware bundle. The SBL validates/authenticates the firmware bound to the OEM root-of-trust or to the silicon manufacturer root-of-trust depending on the device configuration. In this example, the SBL validates/authenticates the secondary SBL. If the authentication fails, the routine generates an error (626). Upon successfully, authentication, the Secondary SBL can optionally perform additional firmware validation/authentication or other system security policy enforcement prior to handing off control to the main firmware (628).

Flexible and Low Power Cache Memory Architecture

Microcontrollers and other embedded processors such as the microcontroller system 100 require an increasing amount of memory as software becomes more complex and as the number of peripherals (e.g., ADCs, GPUs, USB ports, etc.) grows. To manage this challenge, many chips employ a memory hierarchy that includes on-chip tightly coupled memories (TCMs) that can be accessed in a single clock cycle, on-chip system memories that can typically be accessed in two or more clock cycles, and serial or parallel interfaces to off-chip memories that often take many cycles to access. Cache memories can be used to reduce the number of cycles required to access system memories and off-chip memories. The example microcontroller system 100 includes an example flexible and low power cache memory architecture shown in FIG. 7.

Figure 7:
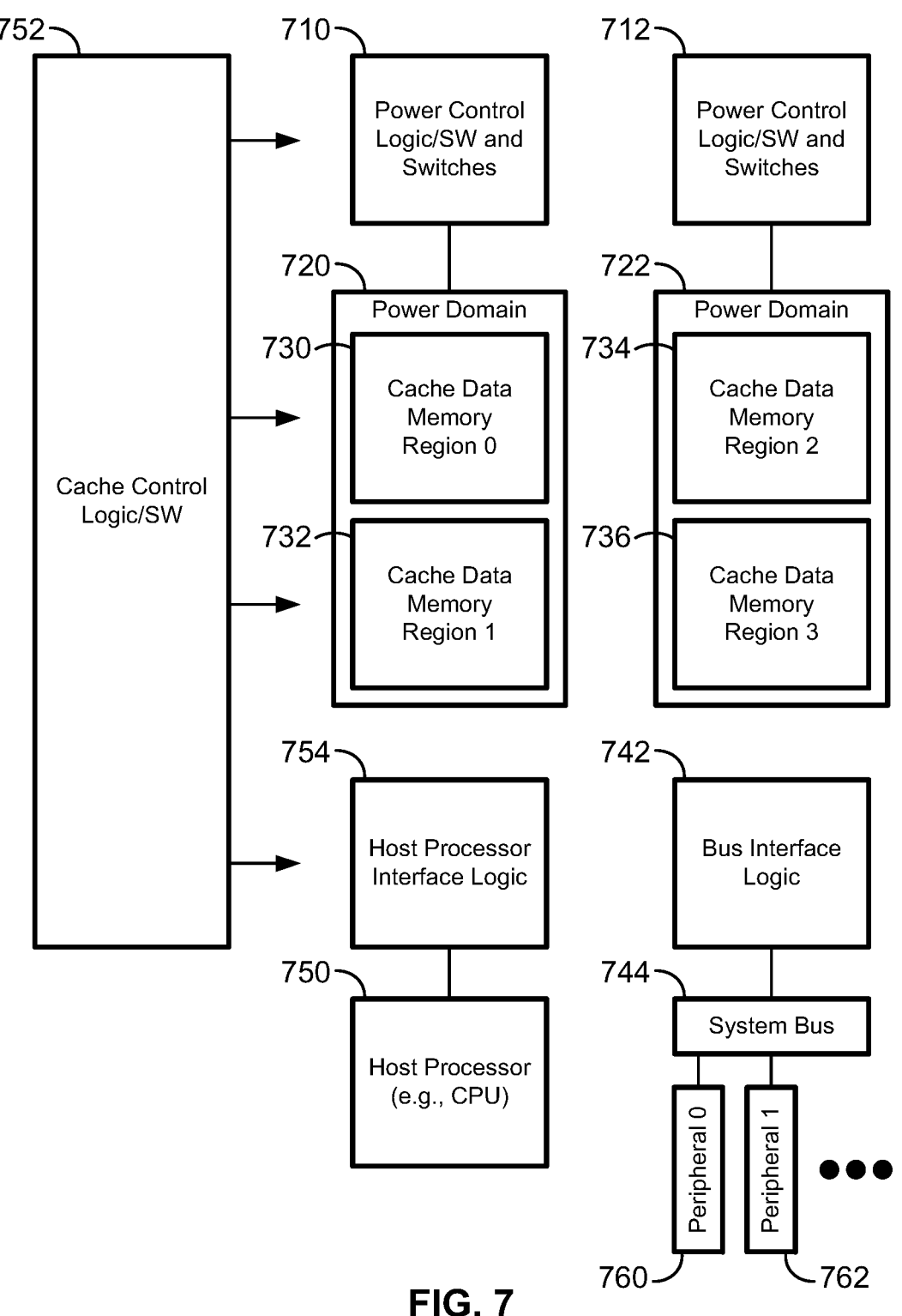
FIG. 7 is a block diagram of a flexible and low power cache memory architecture for the example microcontroller system in FIG. 1.

FIG. 7 shows two power control modules 710 and 712 that may be power control logic/software and switches. The power control modules 710 and 712 control two respective power domains 720 and 722. Each of the power domains 720 and 722 have various cache data memory regions. Thus, the power domain 720 includes cache memory regions 730 and 732. The power domain 722 includes cache memory regions 734 and 736. The cache architecture includes multiple cache data memory regions such as the regions 730, 732, 734, and 736 that store data read from a peripheral 740 (e.g., an on-chip system memory or a serial interface that reads data from an off-chip memory). The data is passed through bus interface logic 742 to a system bus 744 to the peripherals 740. The cache data memory regions are grouped into the power domains 720 and 722. Each power domain contains one or more cache data memory region and may be power gated independently from other power domains using the power control logic (or control SW) and power switches in the control modules 710 and 712.

In normal operation, a host processor 750 causes the power control logic (or control SW) modules 710 and 712 to power up a desired set of cache data memory regions and power down any unused regions in the power domains 720 and 722. The host processor 750 then issues read requests to a cache control logic (or software) 752 through host interface logic 754. If already present in one of the cache data memory regions, then the cache control logic 752 will return the requested data to the host processor 750. If the requested data is not present in one of the cache data memory regions, then the cache control logic 752 will cause the desired data to be fetched from one or more peripherals 740 through the system bus 744. Once the data has been fetched from the targeted peripheral, it will be both stored in one of the cache data memory regions and returned to the host processor 750.

A cache like the one described here maps many different pieces of data into each location inside a particular cache data memory region. Two different pieces of data can thus "collide" in a single location, which causes one of those pieces of data to be over-written. The next time that particular data is requested, it must be re-fetched from the targeted peripheral at a cost of many clock cycles (and significant power). To prevent this kind of "cache thrashing," individual cache data memory regions can be permanently or temporarily mapped to one or more peripherals using the cache control logic (or software). For example, in FIG. 7, a peripheral 0 (760) of the peripherals 740 can be mapped to the cache data memory region 0 (730) while a peripheral 1 (762) can be mapped to the cache data memory regions 1, 2, and 3 (732, 734, and 736). The data fetched from peripheral 0 (760) will only be stored in the cache data memory region 0 (730). The data fetched from peripheral 1 (762) will only be stored in cache data memory regions 1, 2, and 3 (732, 734, and 736). The mapping can be set statically or can be changed dynamically depending on workload or software selection.

As used in this application, the terms "component," "module," "system," or the like, generally refer to a computer-related entity, either hardware (e.g., a circuit), a combination of hardware and software, software, or an entity related to an operational machine with one or more specific functionalities. For example, a component may be, but is not limited to being, a process running on a processor (e.g., digital signal processor), a processor, an object, an executable, a thread of execution, a program, and/or a computer. By way of illustration, both an application running on a controller, as well as the controller, can be a component. One or more components may reside within a process and/or thread of execution, and a component may be localized on one computer and/or distributed between two or more computers. Further, a "device" can come in the form of specially designed hardware, generalized hardware made specialized by the execution of software thereon that enables the hardware to perform specific function, software stored on a computer-readable medium, or a combination thereof.

The terminology used herein is for the purpose of describing particular embodiments only, and is not intended to be limiting of the invention. As used herein, the singular forms "a," "an," and "the" are intended to include the plural forms as well, unless the context clearly indicates otherwise. Furthermore, to the extent that the terms "including,"

"includes," "having," "has," "with," or variants thereof, are used in either the detailed description and/or the claims, such terms are intended to be inclusive in a manner similar to the term "comprising."

Unless otherwise defined, all terms (including technical and scientific terms) used herein have the same meaning as commonly understood by one of ordinary skill in the art. Furthermore, terms, such as those defined in commonly used dictionaries, should be interpreted as having a meaning that is consistent with their meaning in the context of the relevant art, and will not be interpreted in an idealized or overly formal sense unless expressly so defined herein.

While various embodiments of the present invention have been described above, it should be understood that they have been presented by way of example only, and not limitation. Although the invention has been illustrated and described with respect to one or more implementations, equivalent alterations and modifications will occur or be known to others skilled in the art upon the reading and understanding of this specification and the annexed drawings. In addition, while a particular feature of the invention may have been disclosed with respect to only one of several implementations, such feature may be combined with one or more other features of the other implementations as may be desired and advantageous for any given or particular application. Thus, the breadth and scope of the present invention should not be limited by any of the above described embodiments. Rather, the scope of the invention should be defined in accordance with the following claims and their equivalents.

What is claimed is:

1. A low power analog to digital converter system comprising:
   a first analog signal input receiving an input signal;
   a first programmable gain amplifier receiving the input signal;
   an analog to digital converter (ADC) coupled to an output of the first programmable gain amplifier and providing a digital output signal; and
   a controller coupled to the first programmable gain amplifier and the ADC, the controller selecting and enabling either a reduced power mode or a power up mode for the first programmable gain amplifier and the ADC, wherein the power up mode is selected and enabled when the input signal is to be sampled to operate the first programmable gain amplifier and the ADC to sample the input signal; and
   a buffer coupled between the output of the first programmable gain amplifier and the ADC, the buffer having a high bandwidth to enable fast settling of the input signal, wherein the controller selects and enables the power up mode for the buffer when the input signal is to be sampled.

2. The converter system of claim 1, wherein the reduced power mode includes one of: providing the low voltage to at least one of the first programmable gain amplifier and ADC; or power gating at least one of the first programmable gain amplifier and ADC.

3. The converter system of claim 1, wherein the converter system is integrated into a system on chip.

4. The converter system of claim 1, further comprising an anti-aliasing filter coupled between the output of the first programmable gain amplifier and the ADC.

5. The converter system of claim 1, further comprising:
   a second analog input; and
   a multiplexer having inputs coupled to the first and second analog inputs, the multiplexer controlled by the controller to route the first or second analog inputs to the ADC as two separate channels.

6. The converter system of claim 1, wherein the controller is software executed by a general processor.

7. The converter system of claim 1, wherein the controller is an integrated circuit.

8. The converter system of claim 1, wherein the ADC is a successive approximation register (SAR) ADC.

9. The converter system of claim 1, wherein the controller controls power to the ADC to enter the reduced power mode between each sample from the first analog input.

10. The converter system of claim 1, wherein the controller is operable to change the gain of the first programmable gain amplifier based on synchronization to sampling of the input signal by the ADC.

11. The system of claim 1 further comprising a comparator coupled to the output of the programmable gain amplifier, wherein the comparator detects when an input signal is above a wake up threshold, wherein the controller wakes the ADC based on the output of the comparator detecting the input signal is above the wake up threshold.

12. The system of claim 1 further comprising a second programmable gain amplifier coupled to the first analog input, the second programmable gain amplifier having a low gain for signals that will not cause saturation of the ADC, and wherein the first programmable gain amplifier is set for a higher gain value to detect smaller amplitude signals, wherein the ADC provides outputs from the first and second programmable gain amplifiers, and wherein the controller selects the ADC output from either the first or second programmable gain amplifier.

13. The system of claim 1 further comprising a second programmable gain amplifier coupled to the first analog input, the second programmable gain amplifier having a gain equivalent to a gain of the first programmable gain amplifier, wherein the controller averages the outputs of the ADC from the first and second programmable gain amplifiers.

14. The system of claim 1, wherein the first analog input is coupled to an audio microphone.

15. The system of claim 1, wherein the first analog input is coupled to an analog sensor of one of the group consisting of temperature sensors, light sensors, biosensors, battery voltage level sensors, touch sensors, force sensors, and strain sensors.

16. A system on chip for audio processing, the system on chip comprising:

an audio data input receiving an audio input signal;

a first programmable gain amplifier receiving an audio input signal from the audio data input;

an analog to digital converter (ADC) coupled to the output of the programmable gain amplifier and providing a digital output signal; and a controller coupled to the first programmable gain amplifier and ADC, the controller selecting and enabling either a reduced power mode or a power up mode for the first programmable gain amplifier and the ADC, wherein the power up mode is selected and enabled when the audio input signal is to be sampled to operate the first programmable gain amplifier and the ADC to sample the audio input signal; and a buffer coupled between the output of the first programmable gain amplifier and the ADC, the buffer having a high bandwidth to enable fast settling of the input signal, wherein the controller selects and enables the power up mode for the buffer when the input signal is to be sampled.

17. The system on chip of claim 16 further comprising a comparator coupled to the output of the programmable gain amplifier, wherein the comparator detects when an input signal is above a wake up threshold, wherein the controller wakes the ADC based on the output of the comparator detecting the input signal is above the wake up threshold.

18. The system on chip of claim 16 further comprising a second programmable gain amplifier coupled to the audio data input, the second programmable gain amplifier having a low gain for signals that will not cause saturation of the ADC, and wherein the first programmable gain amplifier is set for a higher gain value to detect smaller amplitude signals, wherein the ADC provides outputs from the first and second programmable gain amplifiers, and wherein the controller selects the ADC output from either the first or second programmable gain amplifier.

19. The system on chip of claim 16 further comprising a second programmable gain amplifier coupled to the first analog input, the second programmable gain amplifier having a gain equivalent to a gain of the first programmable gain amplifier, wherein the controller averages the outputs of the ADC from the first and second programmable gain amplifiers.

* * * * *